United States Patent
Shih

(10) Patent No.: US 6,204,134 B1
(45) Date of Patent: Mar. 20, 2001

(54) METHOD FOR FABRICATING A SELF ALIGNED CONTACT PLUG

(75) Inventor: Cheng-Yeh Shih, Hsin-Chu (TW)

(73) Assignee: Taiwan Semiconductor Manufacturing Company, Hsin-Chu (TW)

(*) Notice: Subject to any disclaimer, the term of this patent is extended or adjusted under 35 U.S.C. 154(b) by 0 days.

(21) Appl. No.: 09/431,239

(22) Filed: Nov. 1, 1999

(51) Int. Cl.$^7$ .................................................. H01L 21/336
(52) U.S. Cl. ........................ 438/301; 438/586; 438/629; 438/631; 438/647; 438/657
(58) Field of Search ................................... 438/233, 279, 438/299, 301, 303, 629, 633, 647, 657, 672, 684, 631

(56) References Cited

U.S. PATENT DOCUMENTS

| | | | |
|---|---|---|---|
| 5,480,814 | * 1/1996 | Wuu et al. | 438/279 |
| 5,607,724 | 3/1997 | Beingless et al. | 427/255.1 |
| 5,607,879 | 3/1997 | Wuu et al. | 437/193 |
| 5,631,179 | 5/1997 | Sung et al. | 438/264 |
| 5,763,303 | 6/1998 | Liaw et al. | 438/210 |
| 5,792,689 | * 8/1998 | Yang et al. | 438/253 |
| 5,807,779 | 9/1998 | Liaw | 438/279 |
| 5,930,675 | * 7/1999 | Hada | 438/647 |
| 5,943,569 | * 8/1999 | Shih et al. | 438/253 |

\* cited by examiner

Primary Examiner—T. N. Quach
(74) Attorney, Agent, or Firm—George O. Saile; Stephen B. Ackerman; William J. Stoffel

(57) ABSTRACT

This invention provides a method for forming a self aligned contact plug with low contact resistance in a semiconductor device using a two step process of (1) forming a high temperature polysilicon film and (2) forming a furnace doped polysilicon layer. The process begins by providing a substrate structure, having a first gate structure and a second gate structure thereon and having a contact area between the first gate structure and the second gate structure. An inter level dielectric layer is formed over the first gate structure and the second gate structure. The interlevel dielectric layer is patterned to form a self aligned contact opening over the contact area. Impurity ions are implanted into the substrate structure through the self aligned contact opening to form source and drain regions. In the key steps, a high temperature polysilicon film is formed over the source and drain regions, and a furnace doped polysilicon layer is formed over the high temperature polysilicon film. The furnace doped polysilicon layer and the high temperature polysilicon film are planarized to form a polysilicon self aligned contact plug.

17 Claims, 3 Drawing Sheets

METHOD FOR FABRICATING A SELF ALIGNED CONTACT PLUG

BACKGROUND OF INVENTION

1) Field of the Invention

This invention relates generally to fabrication of semiconductor devices and more particularly to a two step process for forming a doped polysilicon self aligned contact plug with low contact resistance.

2) Description of the Prior Art

The use of self aligned contact (SAC) processes has resulted in higher performing, lower cost, and increased density semiconductor devices. However, contact resistance is a key limitation of current SAC processes, particularly as processing speed in creases. High contact resistance and variability in contact resistance from contact to contact can reduce device life and cause reliability problems.

The importance of overcoming the various deficiencies noted above is evidenced by the extensive technological development directed to the subject, as documented by the relevant patent and technical literature. The closest and apparently more relevant technical developments in the patent literature can be gleaned by considering the following patents.

U.S. Pat. No. 5,807,779 (Liaw) shows a polysilicon self aligned contact process.

U.S. Pat. No. 5,763,303 (Liaw) shows a rapid thermal chemical vapor deposition procedure for a self aligned, polycide contact structure, wherein load and evacuation steps are performed in-situ at room temperature, followed by poly and tungsten depositions.

U.S. Pat. No. 5,631,179 (Sung et al.) and U.S. Pat. No. 5,607,879 (Wuu et al.) teach self aligned contact processes.

U.S. Pat. No. 5,607,724 (Beinglass et al.) shows a wafer chamber which can be used for high temperature chemical vapor deposition of polycrystalline silicon.

SUMMARY OF THE INVENTION

It is an object of the present invention to provide a method for fabricating a self aligned contact plug using a two-step poly deposition.

It is another object of the present invention to provide a method for forming a self aligned contact plug with low Rc using a reduced thermal budget.

It is another object of the present invention to provide a method for forming a self aligned contact plug with improved step coverage and gap filling.

It is another object of the present invention to provide a method for forming a self aligned contact plug with reduced junction leakage It is yet another object of the present invention to provide a method for forming a self aligned contact plug with improved Rc uniformity To accomplish the above objectives, the present invention provides a method for forming a self aligned contact plug with low contact resistance in a semiconductor device using a two step process of (1) forming a high temperature polysilicon film and (2) forming a furnace doped polysilicon layer. The process begins by providing a substrate structure, having a first gate structure and a second gate structure thereon and having a contact area between the first gate structure and the second gate structure. An inter level dielectric layer is formed over the first gate structure and the second gate structure. The interlevel dielectric layer is patterned to form a self aligned contact opening over the contact area. Impurity ions are implanted into the substrate structure through the self aligned contact opening to form source and drain regions. In the key steps, a high temperature polysilicon film is formed over the source and drain regions, and a furnace doped polysilicon layer is formed over the high temperature polysilicon film. The furnace doped polysilicon layer and the high temperature polysilicon film are planarized to form a polysilicon self aligned contact plug.

The present invention provides considerable improvement over the prior art. Because HTF polysilicon provides a good interaction with the silicon substrate, contact resistance is reduced dramatically by the present invention down to about 3500 ohms. Uniformity of the contact resistance is improved as well, with a standard deviation of only about 49 ohms. The present invention also provides good step coverage typical of furnace dopd polysilicon resulting in low junction leakage properties.

The present invention achieves these benefits in the context of known process technology. However, a further understanding of the nature and advantages of the present invention may be realized by reference to the latter portions of the specification and attached drawings.

Brief Description of the Drawings

The features and advantages of a semiconductor device according to the present invention and further details of a process of fabricating such a semiconductor device in accordance with the present invention will be more clearly understood from the following description taken in conjunction with the accompanying drawings in which like reference numerals designate similar or corresponding elements, regions and portions and in which.

DETAILED DESCRIPTION OF THE INVENTION

The present invention will be described in detail with reference to the accompanying drawings. The present invention provides a method for forming a self aligned contact plug with low contact resistance in a semiconductor device using a two step process of (1) forming a high temperature polysilicon film and (2) forming a furnace doped polysilicon layer.

Figure 1:
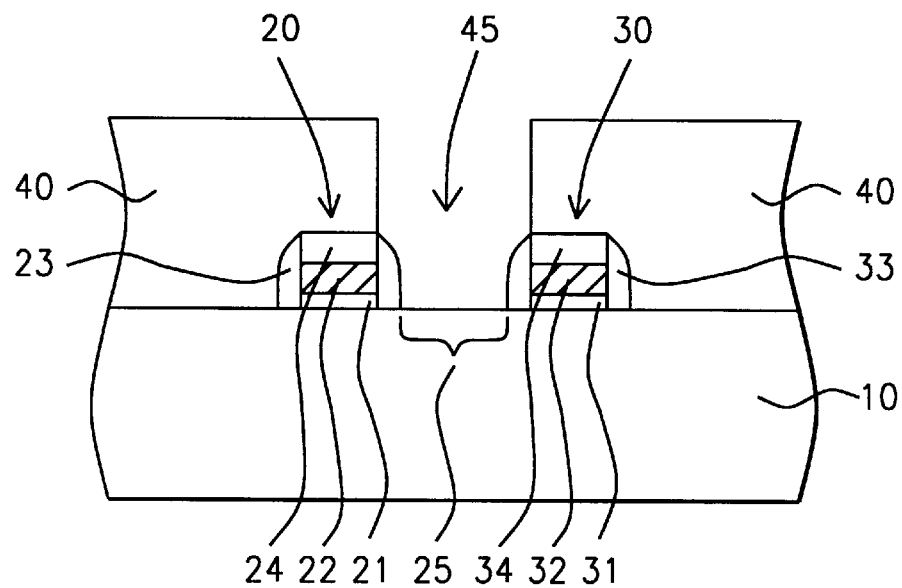
FIGS. 1, 2, 3, 4 & 5 illustrate sequential sectional views of a process for fabrication of a self aligned contact plug according to the invention.

Referring to FIG. 1, the process begins by providing a substrate structure (10) for a semiconductor device, such as for a DRAM device. The substrate structure (10) has a first gate structure (20) and a second gate structure (30) formed thereon, as is known in the art, and a contact area (25) between the first gate structure (20) and the second gate structure (30). The first gate structure (20) and the second gate structure (30) preferably comprise a gate oxide layer (21, 31), a gate electrode (22, 32) oxide and/or nitride spacers (23, 33), and oxide and/or nitride cap layers (24,34). An inter level dielectric layer (40) is formed over the first gate structure (20) and the second gate structure (30). The interlevel dielectric layer (40) can be composed of a variety of dielectric materials including plasma enhanced chemical vapor deposition silicon dioxide, spin on glass (SOG), sub-atmospheric chemical vapor deposition (SACVD) oxide, or most preferably high density plasma (HDP) oxide.

The interlevel dielectric layer (40) is patterned to form a self aligned contact opening (45) over the contact area (25) using photolithography and etching.

Figure 2:
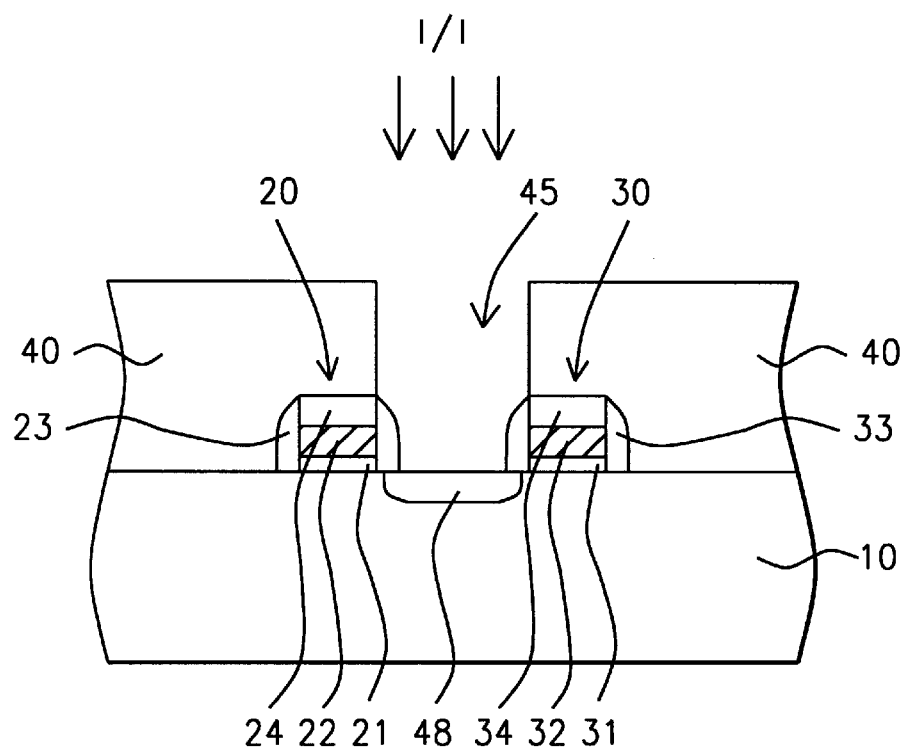

Referring to FIG. 2, impurity ions are implanted into the substrate structure (10) through the self aligned contact opening (45) to form source and drain regions (48) in the contact area (25). The impurity ions can be $PH_3$ or most preferably P. The impurity ions are implanted into the substrate structure at an energy of between about 20 KeV and 60 KeV and at a dose of between about 1E13 atm/cm$^2$ and 1E15 atm/cm$^2$ for P ions. $PH_3$ ions are implanted at an energy of between about 10 KeV and 50 KeV and a dose of between about 1E13 atm/cm$^2$ and 1E15 atm/cm$^2$.

Figure 3:
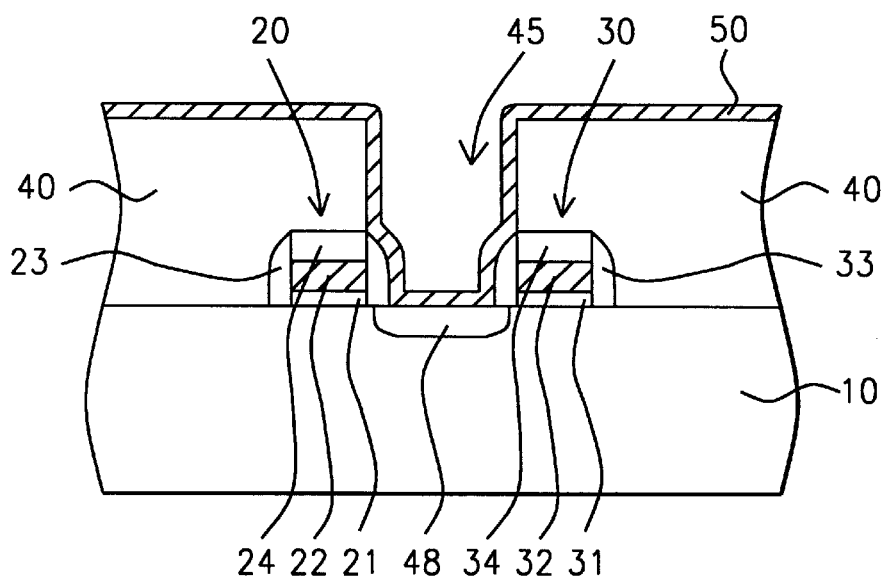

In a key step, as shown in FIG. 3, a high temperature polysilicon film (50) is formed over the source and drain regions (48) by prolysing silane at a temperature of between about 620° C. and 680° C. for a time of between about 8 seconds and 20 seconds, and at a pressure of between about 110 Pa and 170 Pa. The high temperature polysilicon film (50) preferably has a thickness of between about 100 Angstroms and 5000 Angstroms, more preferably between 200 Angstroms and 1500 Angstroms. The furnace high temperature polysilicon film (50) is formed using $SiH_4$ gas at a flow rate of between about 0.2 liters/minute and 0.8 liters/minute and a $PH_3$ gas flow rate of between about 0.07 liters/minute and 0.12 liters/minute, but the flow rates can be scaled up or down to accomodate various chamber sizes provided that the molar ratios are maintained.

Figure 4:
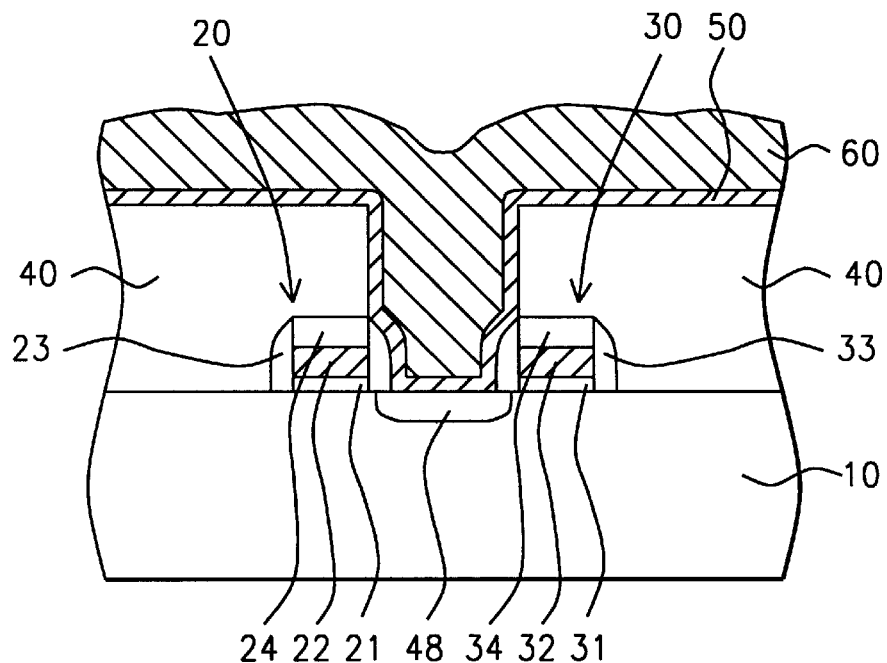

In a second key step, as shown in FIG. 4, a furnace doped polysilicon layer (60) is formed over the high temperature polysilicon film (50) at a temperature of between about 540° C. and 600° C., preferably between 550° C. and 590° C. and a pressure of between about 40 Pa and 80 Pa. The furnace doped polysilicon layer (60) preferably has a thickness of between about 1000 Angstroms and 6000 Angstroms, more preferably between 2000 Angstroms and 5000 Angstroms. The furnace doped polysilicon layer (60) is formed using SiH4 gas at a flow rate of between about 0.3 liters/minute and 1.8 liters/minute and a $PH_3$ gas flow rate of between about 0.02 liters/minute and 0.08 liters/minute, but the flow rates can be scaled up or down to accomodate various chamber sizes provided that the molar ratios are maintained.

In the preferred embodiment, the high temperature polysilicon film (50) is formed in deposition chamber such as the Poly Centura® single wafer by Applied Materials in California, USA. The the furnace doped polysilicon layer (60) is preferably formed in a furnace such as the V315 manufactured by Kokusai. An advantage of the furnace doped polysilicon is that it provides good step coverage.

Figure 5:
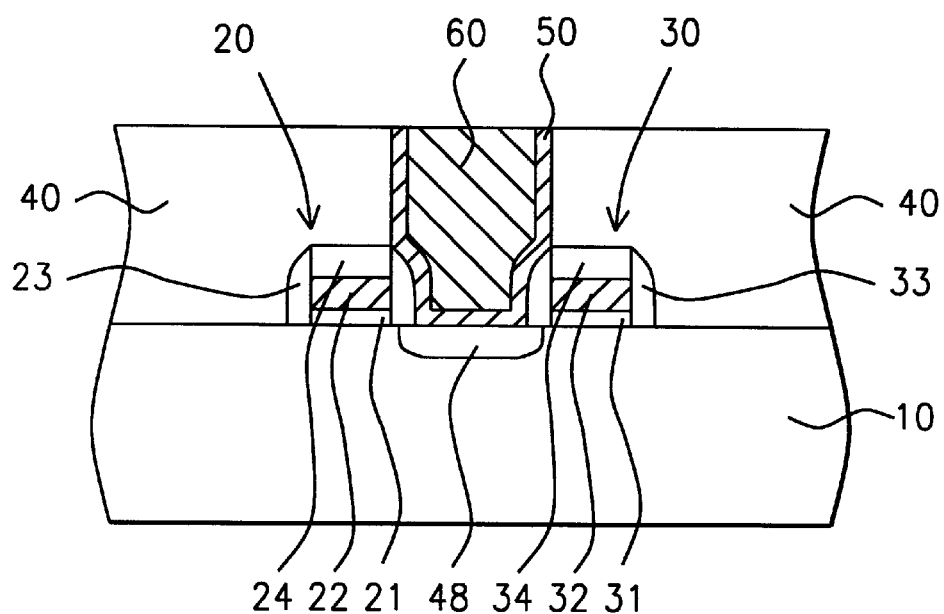

Referring to FIG. 5, the furnace doped polysilicon layer (60) and the high temperature polysilicon film are planarized to form a polysilicon self aligned contact plug. The furnace doped polysilicon layer (60) and the high temperature polysilicon film (50) can be planarized using a chemical mechanical polishing process. Alternatively, the furnace doped polysilicon layer (60) and the high temperature polysilicon film (50) can be planarized using an etch back process.

The key advantages of the present invention are that the contact resistance is reduced dramatically by the present invention down to about 3500 ohms. Uniformity of the contact resistance is improved as well, with a standard deviation of only about 49 ohms. The present invention also provides good step coverage and low junction leakage properties.

A split lot experiment was performed using the SAC. plug of the present invention, a doped polysilicon plug and a lightly doped polysilicon plug. The resulting means and standard deviations for contact resistance, breakdown voltage and junction leakage are shown in table 1. A SAC plug test structure fabricated according to the present invention provided much lower contact resistance as well as lower leakage current.

TABLE 1

|  | lightly doped (P, 3E19) | doped polysilicon (P, 1E20) | HTF/furnace doped poly (invention) |
|---|---|---|---|
| contact resistance (ohms) | mean = 2.7E5 std dev = 1.07E5 | mean = 6.7E3 std dev = 599 | mean = 3.5E3 std dev = 48.7 |
| breakdown voltage (volts) | mean = 5.38 std dev = 0.16 | mean = 5.42 std dev = 0.4 | mean = 5.72 std dev = 0.12 |
| junction leakage (fA/contact hole) | mean = 30.7 std dev = 0.93 | mean = 29.98 std dev = 0.49 | mean = 27.2 std dev = 0.53 |

While the invention has been particularly shown and described with reference to the preferred embodiments thereof, it will be understood by those skilled in the art that various changes in form and details may be made without departing from the spirit and scope of the invention.

What is claimed is:

1. A method for forming a self aligned contact plug, comprising the steps of:

a. providing a substrate structure, having a first gate structure and a second gate structure thereon and having a contact area between said first gate structure and said second gate structure; said first gate structure and said second gate structure having an inter level dielectric layer thereover;

b. patterning said interlevel dielectric layer to form a self aligned contact opening over said contact area;

c. implanting impurity ions into said substrate structure through said self aligned contact opening to form source and drain regions;

d. forming a high temperature polysilicon film over said source and drain regions;

e. forming a furnace doped polysilicon layer over said high temperature polysilicon film; and f. planarizing said furnace doped polysilicon layer and said high temperature polysilicon film to form a polysilicon self aligned contact plug.

2. The method of claim 1 wherein said impurity ions are P ions implanted into said substrate structure at an energy of between about 20 KeV and 60 KeV and at a dose of between about 1E13 atm/cm$^2$ and 1E15 atm/cm$^2$.

3. The method of claim 1 wherein said impurity ions are $PH_3$ ions implanted into said substrate structure at an energy of between about 10 KeV and 50 KeV and at a dose of between about 1E13 atm/cm$^2$ and 1E15 atm/cm$^2$.

4. The method of claim 1 wherein said high temperature polysilicon film has a thickness of between about 100 Angstroms and 5000 Angstroms and said furnace doped polysilicon layer has a thickness of between about 1000 Angstroms and 6000 Angstroms.

5. The method of claim 1 wherein said high temperature polysilicon film has a thickness of between about 200 Angstroms and 1500 Angstroms and said furnace doped polysilicon layer has a thickness of between about 2000 Angstroms and 5000 Angstroms.

6. The method of claim 1 wherein said high temperature polysilicon film is formed at a temperature of between about 620° C. and 680° C. and at a pressure of between about 110 Pa and 170 Pa in an atmosphere comprising $SiH_4$ and $PH_3$.

7. The method of claim 1 wherein said furnace doped polysilicon layer is formed at a temperature of between about 550° C. and 590° C. and at a pressure of between about 40 Pa and 80 Pa in an atmosphere comprising $SiH_4$ and $PH_3$.

8. The method of claim 1 wherein said furnace doped polysilicon layer and said high temperature polysilicon film are planarized using a chemical mechanical polishing process.

9. The method of claim 1 wherein said furnace doped polysilicon layer and said high temperature polysilicon film are planarized using an etch back process.

10. The method of claim 1 wherein said high temperature polysilicon film is formed in a high temperature film deposition chamber and said furnace doped polysilicon layer is formed in a furnace.

11. A method for forming a polysilicon self aligned contact plug in a DRAM device, comprising the steps of:
   a. providing a substrate structure for a DRAM device, having a first gate structure and a second gate structure thereon and having a contact area between said first gate structure and said second gate structure; said first gate structure and said second gate structure having an inter level dielectric layer thereover; said interlevel dielectric layer having a self aligned contact opening over said contact area;
   b. implanting impurity ions into said substrate structure through said self aligned contact opening to form source and drain regions;
   c. forming a high temperature polysilicon film over said source and drain regions in a high temperature deposition chamber at a temperature of between about 620° C. and 680° C. and at a pressure of between about 110 Pa and 170 Pa in an atmosphere comprising $SiH_4$ and $PH_3$;
   d. forming a furnace doped polysilicon layer over said high temperature polysilicon film in a furnace at a temperature of between about about 550° C. and 590° C. and at a pressure of between about 40 Pa and 80 Pa in an atmosphere comprising $SiH_4$ and $PH_3$; and
   e. planarizing said furnace doped polysilicon layer and said high temperature polysilicon film to form a polysilicon self aligned contact plug.

12. The method of claim 11 wherein said impurity ions are P ions implanted into said substrate structure at an energy of between about 20 KeV and 60 KeV and at a dose of between about 1E13 atm/cm$^2$ and 1E15 atm/cm$^2$.

13. The method of claim 11 wherein said impurity ions are $PH_3$ ions implanted into said substrate structure at an energy of between about 10 KeV and 50 KeV and at a dose of between about 1E13 atm/cm$^2$ and 1E15 atm/cm$^2$.

14. The method of claim 11 wherein said high temperature polysilicon film has a thickness of between about 100 Angstroms and 5000 Angstroms and said furnace doped polysilicon layer has a thickness of between about 1000 Angstroms and 6000 Angstroms.

15. The method of claim 11 wherein said high temperature polysilicon film has a thickness of between about 200 Angstroms and 1500 Angstroms and said furnace doped polysilicon layer has a thickness of between about 2000 Angstroms and 5000 Angstroms.

16. The method of claim 11 wherein said furnace doped polysilicon layer and said high temperature polysilicon film are planarized using a chemical mechanical polishing process.

17. The method of claim 11 wherein said furnace doped polysilicon layer and said high temperature polysilicon film are planarized using an etch back process.

* * * * *